(12) United States Patent
Zhao

(10) Patent No.: US 10,553,615 B2
(45) Date of Patent: Feb. 4, 2020

(54) ARRAY SUBSTRATE WITH VIA HOLES HAVING GRADUALLY DECREASED AREAS, PHOTOMASK FOR MANUFACTURING ARRAY SUBSTRATE, AND DISPLAY DEVICE COMPRISING ARRAY SUBSTRATE

(71) Applicant: WUHAN CHINA STAR OPTOELECTRONICS TECHNOLOGY CO., LTD., Wuhan, Hubei (CN)

(72) Inventor: Kaixiang Zhao, Hubei (CN)

(73) Assignee: WUHAN CHINA STAR OPTOELECTRONICS TECHNOLOGY CO., LTD, Wuhan (CN)

( * ) Notice: Subject to any disclaimer, the term of this patent is extended or adjusted under 35 U.S.C. 154(b) by 0 days.

(21) Appl. No.: 15/539,810

(22) PCT Filed: May 25, 2017

(86) PCT No.: PCT/CN2017/085840
§ 371 (c)(1),
(2) Date: Aug. 6, 2018

(87) PCT Pub. No.: WO2018/196072
PCT Pub. Date: Nov. 1, 2018

(65) Prior Publication Data
US 2018/0358382 A1 Dec. 13, 2018

(30) Foreign Application Priority Data
Apr. 26, 2017 (CN) .......................... 2017 1 0280444

(51) Int. Cl.
*H01L 27/12* (2006.01)
*G06F 3/047* (2006.01)
(Continued)

(52) U.S. Cl.
CPC ...... *H01L 27/124* (2013.01); *G02F 1/136227* (2013.01); *G03F 1/00* (2013.01);
(Continued)

(58) Field of Classification Search
CPC ... H01L 27/124; H01L 27/1288; H01L 27/12; G06F 3/047; G06F 3/0412; G02F 2201/123; G02F 2201/121; G03F 1/00
(Continued)

(56) References Cited

U.S. PATENT DOCUMENTS 6,028,650 A  2/2000 Kuroha et al.
2004/0021786 A1* 2/2004 Nakamura .......... G06K 9/0004
  348/294
(Continued)

FOREIGN PATENT DOCUMENTS

CN  1287287 A  3/2001
CN  1971910 A  5/2007
(Continued)

*Primary Examiner* — Alexander O Williams

(57) ABSTRACT

Provided is an array substrate, a photomask, and a display device. The array substrate includes a substrate, a common electrode layer on which a plurality of first via holes are provided at predetermined positions, a passivation layer having a plurality of second via holes disposed concentrically with the first via holes, and a pixel electrode layer having a plurality of pixel electrodes. Areas of the first via holes are configured to gradually decrease in the direction from an output proximal end to an output distal end of a gate line.

19 Claims, 2 Drawing Sheets

(51) Int. Cl.
  *G02F 1/1362* (2006.01)
  *G06F 3/041* (2006.01)
  *G03F 1/00* (2012.01)
  *H01L 29/786* (2006.01)

(52) U.S. Cl.
  CPC ............ *G06F 3/047* (2013.01); *G06F 3/0412* (2013.01); *H01L 27/1248* (2013.01); *H01L 27/1288* (2013.01); *H01L 29/78633* (2013.01); *H01L 29/78675* (2013.01); *G02F 2201/121* (2013.01); *G02F 2201/123* (2013.01)

(58) Field of Classification Search
  USPC .......................................................... 257/72
  See application file for complete search history.

(56) References Cited

U.S. PATENT DOCUMENTS

| | | | |
|---|---|---|---|
| 2007/0029613 A1* | 2/2007 | Moriwaki | G02F 1/136213 257/347 |
| 2008/0062345 A1 | 3/2008 | Lee | |
| 2009/0262267 A1* | 10/2009 | Kameyama | G02B 27/1026 349/5 |
| 2010/0283385 A1* | 11/2010 | Maeda | H01L 51/5265 313/504 |
| 2016/0103368 A1* | 4/2016 | Imanishi | G02F 1/133723 349/43 |
| 2016/0187695 A1* | 6/2016 | Cho | G02F 1/13338 349/12 |
| 2016/0349559 A1* | 12/2016 | Woo | G02F 1/13338 |
| 2017/0062539 A1* | 3/2017 | Tsai | H01L 27/3276 |
| 2017/0184887 A1* | 6/2017 | Xiao | H01L 21/02123 |
| 2017/0317104 A1* | 11/2017 | Jeong | H01L 27/1288 |
| 2017/0336662 A1* | 11/2017 | Zhang | G02F 1/1362 |
| 2018/0031939 A1* | 2/2018 | Imazeki | G02F 1/136286 |
| 2018/0180913 A1* | 6/2018 | Yeom | G02F 1/136286 |
| 2018/0321788 A1* | 11/2018 | Kimura | G02F 1/1368 |

FOREIGN PATENT DOCUMENTS

| | | |
|---|---|---|
| CN | 101004527 A | 7/2007 |
| CN | 104102058 A | 10/2014 |

* cited by examiner

ARRAY SUBSTRATE WITH VIA HOLES HAVING GRADUALLY DECREASED AREAS, PHOTOMASK FOR MANUFACTURING ARRAY SUBSTRATE, AND DISPLAY DEVICE COMPRISING ARRAY SUBSTRATE

CROSS-REFERENCE TO RELATED APPLICATIONS

This application claims the priority of Chinese patent application CN 201710280444.9, entitled "Array Substrate, Photomask, and Display Device" and filed on Apr. 26, 2017, the entirety of which is incorporated herein by reference.

FIELD OF THE INVENTION

The present disclosure relates to the technical field of display, and in particular, to an array substrate, a photomask, and a display device.

BACKGROUND OF THE INVENTION

When a liquid display panel displays images, each frame switching is implemented by scanning of scanning lines.

Scanning lines are made of metal materials, which have resistance. As a transmission distance increases, a voltage on a scanning line will decrease, and such phenomenon is referred to as a voltage drop. As shown in FIG. 1, the voltage drop goes from low to high as distances from pixel A, pixel B, and pixel C to an input end of a gate scanning signal get larger.

Specifically, a gate line voltage drop in the existing liquid crystal display panel is expressed as:

$$\Delta Vp = \frac{C_{gs}}{C_{gs} + C_{lc} + C_s} * V_{ghl}$$

wherein, $\Delta Vp$ denotes a voltage drop value; $C_{gs}$ denotes a capacitance between a gate line and a source/drain of a switching element; $C_{lc}$ denotes a liquid crystal capacitance; $C_s$ denotes a storage capacitance; and $V_{ghl}$ denotes a difference between an ideal input voltage and an actual input voltage. Along a direction from an output proximal end to an output distal end of the gate line (i.e., a direction of the gate line away from a scanning signal drive circuit), the actual input voltage on the gate line is gradually reduced and the ideal input voltage does not change, so that $V_{ghl}$ gradually increases.

FIG. 2 schematically shows a voltage drop across pixel A, pixel B and pixel C respectively. The voltage drop goes from low to high as distances from pixel A, pixel B, and pixel C to the input end of the gate scanning signal get larger, i.e., $V_a < V_b < V_a$ denotes the voltage drop across pixel A, and $\Delta V_a$ denotes a feedthrough voltage on pixel A. $V_b$ denotes the voltage drop across pixel B, and $\Delta V_b$ denotes a feedthrough voltage on pixel B. $V_c$ denotes the voltage drop across pixel C, $\Delta V_c$ denotes a feedthrough voltage on pixel C, and $V_{gh}$ denotes an ideal input voltage on the gate line. It can been seen from the aforesaid expression that $\Delta Vp$ may cause an image to be relatively bright near the input end of the gate line and relatively dark away from the input end of the gate line, thereby affecting brightness uniformity of the display panel.

SUMMARY OF THE INVENTION

To solve the above problems, the present disclosure provides an array substrate, a photomask, and a display device, so as to improve brightness uniformity of a display panel.

According to one aspect of the present disclosure, an array substrate is provided. The array substrate comprises:

a substrate, which comprises switching elements and gate lines;

a common electrode layer arranged on the substrate and provided with a common electrode, wherein a plurality of first via holes are provided at predetermined positions on the common electrode layer;

a passivation layer arranged on the common electrode layer and having a plurality of second via holes disposed concentrically with the first via holes;

a pixel electrode layer arranged on the passivation layer and provided with a plurality of pixel electrodes connected to the switching element through corresponding second via holes; and wherein, areas of the first via holes are configured to gradually decrease in a direction along an output proximal end to an output distal end of the gate line.

According one embodiment of the present disclosure, the array substrate further comprises:

a dielectric layer arranged on the common electrode layer; and a touch wiring layer arranged on the dielectric layer, and provided thereon with the passivation layer.

According one embodiment of the present disclosure, the common electrode is configured to serve as a touch electrode and is connected with some wires in the touch wiring layer.

According one embodiment of the present disclosure, the switching element further comprises:

a channel layer arranged on the substrate and including a plurality of conductive channels;

a first insulating layer arranged on the channel layer;

a first conductive layer which is arranged on the first insulating layer and is configured to correspond to the conductive channel, the first conductive layer including a gate of the switching element;

a second insulating layer arranged on the first conductive layer and the exposed first insulating layer;

a second conductive layer arranged on the second insulating layer and including a source and a drain of the switching element for connecting the channel layer; and a flat layer arranged on the second conductive layer and the exposed second insulating layer, and provided thereon with the common electrode layer.

According one embodiment of the present disclosure, the channel layer is made of a low-temperature poly-silicon material and further comprises heavily ion-doped regions disposed at both ends of the conductive channel. The ion heavily doped region comprises a drain region connected with a drain of the switching element, and a source region connected with a source of the switching element.

According one embodiment of the present disclosure, an slightly ion-doped region is provided between the conductive channel and the heavily ion-doped region.

According one embodiment of the present disclosure, the array substrate further comprises a shading layer which is arranged on the substrate and is configured to correspond to the conductive channel.

According one embodiment of the present disclosure, the array substrate further comprises a third insulating layer arranged on the shading layer and the exposed substrate, and provided thereon with the channel layer.

According to the other aspect of the present disclosure, a photomask used for manufacturing the array substrate is provided. The photomask is provided with light transmitting regions corresponding to a plurality of the first via holes, and areas of the light transmitting regions are configured to gradually decrease in the direction from the output proximal end of to the output distal end of the gate line on the substrate.

According to another aspect of the present disclosure, a display device is further provided, which comprises the aforesaid array substrate.

The present disclosure has the following beneficial effects.

In the present disclosure, by configuring areas of first via holes on a common electrode layer to decrease in a direction from an output proximal end to an output distal end of a gate line, the capacitance of the liquid crystal capacitor in each pixel unit in the direction from the output proximal end to the output distal end of the gate line is changed. Thus, the voltage drops are equal across the gate line, and brightness uniformity of the display panel is improved.

Other advantages, objects, and features of the present disclosure will be further explained in the following description, and to some extent, would be obvious to those skilled in the art based on study of the following description. Or, those skilled in the art may obtain teachings from practice of the present disclosure. The objectives and advantages of the present disclosure will be achieved through the structure specifically pointed out in the description, claims, and the accompanying drawings.

BRIEF DESCRIPTION OF THE DRAWINGS

The accompanying drawings provide further understandings of technical solutions of the present application or the prior art, and constitute one part of the description. The drawings expressing embodiments of the present application are used for interpreting the technical solutions of the present application together with the embodiments, not for limiting the technical solutions of the present application. In the drawings.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no conflict, all the technical features mentioned in all the embodiments may be combined together in any manner, and the technical solutions obtained in this manner all fall within the scope of the present disclosure.

Figure 4:
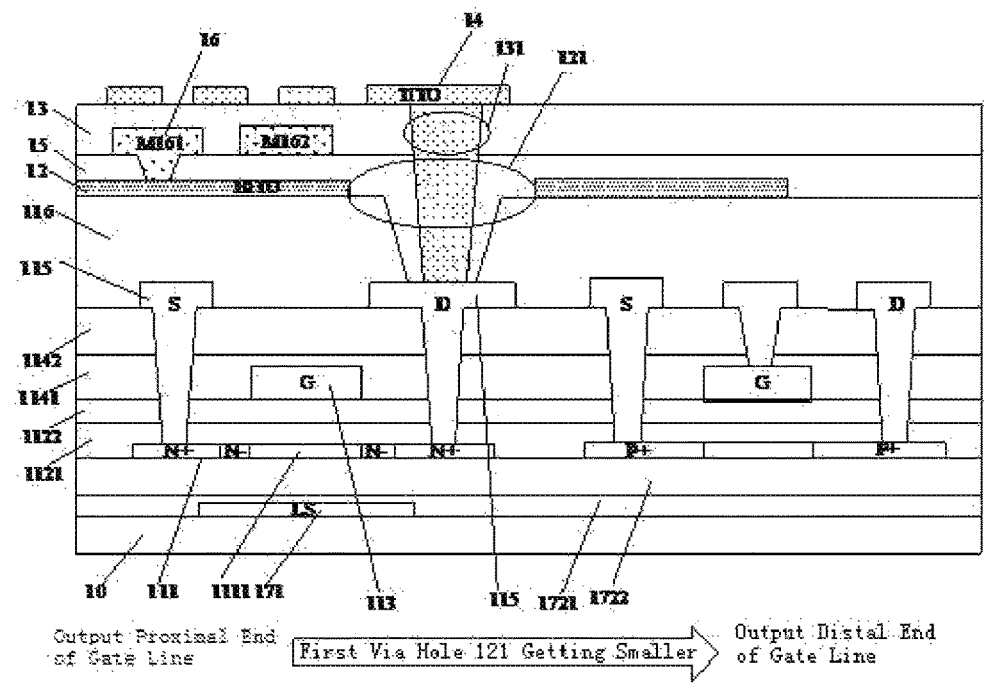
FIG. 4 schematically shows a structure of an array substrate according to the present disclosure.

FIG. 4 schematically shows a structure of an array substrate according to one embodiment of the present disclosure. The present disclosure will be further explained below with reference to FIG. 4.

The array substrate comprises a substrate, a common electrode layer 12, a passivation layer 13, and a pixel electrode layer 14. The substrate comprises switching elements and gate lines (not shown). The common electrode layer 12 is arranged on the substrate and provided with a common electrode BITO. A plurality of first via holes 121 are provided at predetermined positions on the common electrode layer 12. The passivation layer 13 is arranged on the common electrode layer 12 and has a plurality of second via holes 131 disposed concentrically with the first via holes 121. The pixel electrode layer 14 is arranged on the passivation layer 13 and provided with a plurality of pixel electrodes TITO connected to the switching elements through corresponding second via holes. Areas of the first via holes 121 are configured to gradually decrease in a direction from an output proximal end to an output distal end of the gate line so as to change an overlap area of the common electrode and the pixel electrodes in a plurality of pixel units. The direction from the output proximal end to the output distal end of the gate line (the direction indicated by an arrow as shown in FIG. 4) refers to a direction of the gate line away from a scanning signal drive circuit. The scanning signal drive circuit is used for outputting a scanning signal.

It can be known from the expression of a voltage drop across the gate line in a liquid crystal display panel that a liquid crystal capacitance $C_{lc}$ has an effect on the voltage drop value $\Delta Vp$. The larger $C_{lc}$ is, the smaller $\Delta Vp$ is; and the smaller cis, the larger $\Delta Vp$ is. In the liquid crystal display panel, a liquid crystal layer between an array substrate and a color filter substrate can be equivalent to a liquid crystal capacitor. One end of the liquid crystal capacitor is connected to a pixel electrode and the other end is connected to a common electrode. The pixel electrode and the common electrode correspond to two electrodes of the liquid crystal capacitor. Based on the calculation formula of the liquid crystal capacitance: Liquid Crystal Capacitance $C_{lc}$=Dielectric Constant*Inter-electrode Area/Inter-electrode Distance, the Dielectric Constant refers to the dielectric constant of the liquid crystal molecular material; the Inter-electrode Area refers to the overlap area of the pixel electrode and the common electrode; and the Inter-electrode Distance refers to the distance between the pixel electrode and the common electrode (substantially the thickness of the liquid crystal layer).

Figure 1:
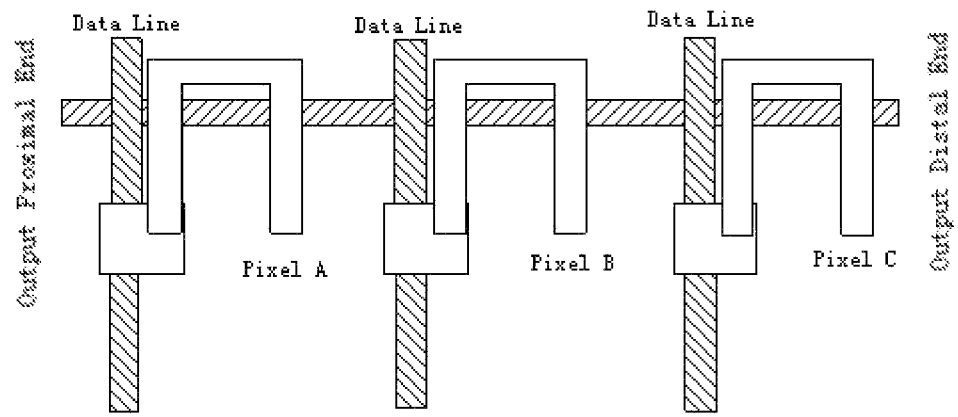
FIG. 1 schematically shows wiring of an array substrate in the prior art.
Figure 2:
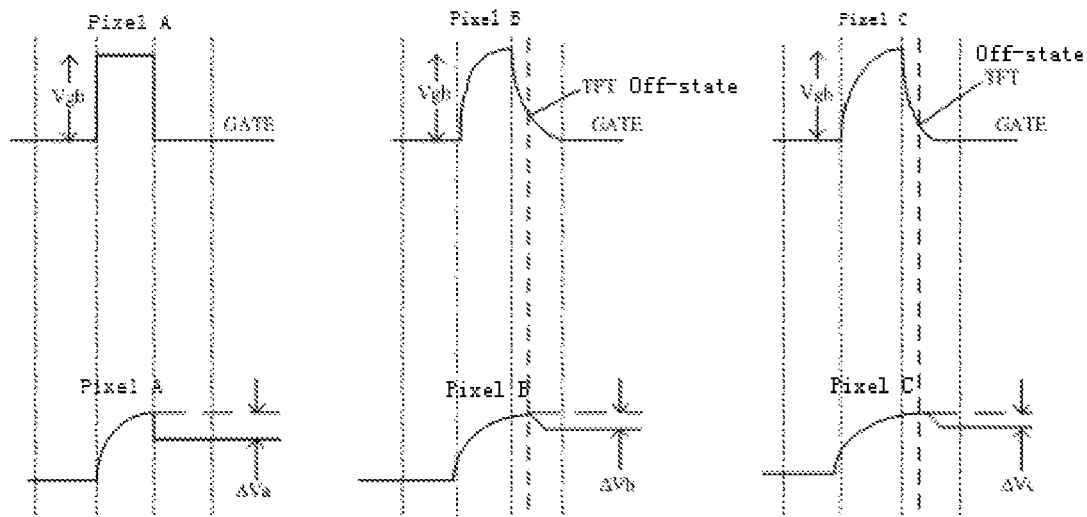
FIG. 2 schematically shows waveform diagrams of driving voltages of pixels shown in FIG. 1.
Figure 3:
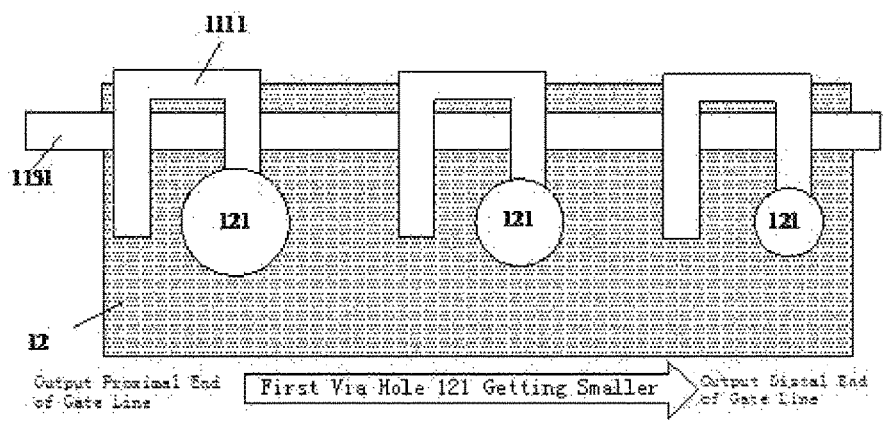
FIG. 3 schematically shows size variations of first via holes according to one embodiment of the present disclosure.

It can be known from the calculation formula of the liquid crystal capacitance $C_{lc}$ that the larger the overlap area of the pixel electrode and the common electrode is, the larger the liquid crystal capacitance $C_{lc}$ is, and the smaller $\Delta Vp$ is; and vice versa. Thus, in the present disclosure, areas of the plurality of first via holes are configured to gradually decrease along the direction from the output proximal end to the output distal end of the gate line, so that the overlap area of the common electrode and each pixel electrode gradually increases in the direction from the output proximal end to the output distal end of the gate line, as shown in FIG. 3. In this manner, the liquid crystal capacitance $C_{lc}$ can be gradually increased in the direction from the output proximal end to the output distal end of the gate line, so that can be smaller. Since $V_{ghl}$ gradually increases and $$\frac{C_{gs}}{C_{gs}+C_{lc}+C_s}$$

decreases in the direction from the output proximal end to the output distal end of the gate line, the product of $V_{ghl}$ and $$\frac{C_{gs}}{C_{gs}+C_{lc}+C_s}$$

across the gate line can be kept constant by adjusting the area of each of the first via holes, so that the voltage drops across the gate line can be equal. In this case, the voltage drops on the pixel electrodes of all the pixel units on the gate line are equal to each other, and voltages on the pixel electrodes of all the pixel units on the gate line are the same. Brightness uniformity of the display panel is thus enhanced.

In one embodiment of the present disclosure, the array substrate further comprises a dielectric layer 15 and a touch wiring layer 16. As shown in FIG. 4, the dielectric layer 15 is arranged on the common electrode layer 12 for spacing the common electrode layer 12 from the touch wiring layer 16. The touch wiring layer 16 is arranged on the dielectric layer, and the passivation layer 13 is arranged on the touch wiring layer 16.

In one embodiment of the present disclosure, the common electrode BITO serves as a touch electrode and is connected with some wires in the touch wiring layer 16. Specifically, as shown in FIG. 4, the common electrode is connected with a first wiring line M161, and a second wiring line M162 is connected with other components.

In one embodiment of the present disclosure, the switching element further comprises a channel layer 111, a first insulating layer, a first conductive layer 113, a second insulating layer, a second conductive layer 115, and a flat layer 116. The channel layer 111 is arranged on the substrate 10, and includes a plurality of conductive channels 1111. The first insulating layer is arranged on the channel layer 111, and includes an insulating layer 1121 made of SiOx and an insulating layer 1122 made of SiNx. The first conductive layer 113 is arranged on the first insulating layer and is configured to correspond to the conductive channel 1111, and includes a gate G of the switching element. The second insulating layer is arranged on the first conductive layer 113 and the exposed first insulating layer, and includes an insulating layer 1141 made of SiOx and an insulating layer 1142 made of SiNx. The second conductive layer 115 is arranged on the second insulating layer, and includes a source S and a drain D of the switching element, for connecting the channel layer. The flat layer 116 is arranged on the second conductive layer 115 and the exposed second insulating layer, and the common electrode layer 12 is arranged on the flat layer.

In one embodiment of the present disclosure, the channel layer 111 is made of a low-temperature poly-silicon material and further comprises heavily ion-doped regions disposed at both ends of the conductive channel. The heavily ion-doped region N+ comprises a drain region connecting the drain D of the switching element, and a source region connecting the source S of the switching element.

In one embodiment of the present disclosure, a slightly ion-doped region is provided between the conductive channel and the heavily ion-doped region. Specifically, as shown in FIG. 4, a slightly ion-doped region N− is provided between the conductive channel 111 and the heavily ion-doped region N+ for reducing an effect on on-state current in the device.

In one embodiment of the present disclosure, the array substrate further comprises a shading layer 171 which is disposed on the substrate 10 and is configured to correspond to the conductive channel 1111, for preventing a backlight from illuminating the conductive channel and affecting performance of the switching element, as shown in FIG. 4.

In one embodiment of the present disclosure, the array substrate further comprises a third insulating layer. The third insulating layer is arranged on the shading layer 171 and the exposed substrate 10, and includes an insulating layer 1721 made of SiOx and an insulating layer 1722 made of SiNx. The channel layer 111 is arranged on the third insulating layer, as shown in FIG. 4.

Figure 5:
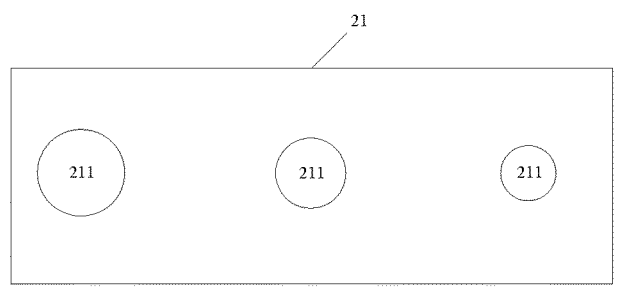
FIG. 5 schematically shows a structure of a photomask according to the present disclosure.

According to another aspect of the present disclosure, a photomask used for manufacturing the aforesaid array substrate is further provided. Specifically, as shown in FIG. 5, the photomask 21 is provided with light transmitting regions 211 corresponding to a plurality of first via holes. Areas of the light transmitting regions are gradually reduced in a direction from an output proximal end to an output distal end of a gate line on the substrate.

According to another aspect of the present disclosure, a display device is further provided. The display device comprises the aforesaid array substrate. The array substrate comprises a substrate 11, a common electrode layer 12, a passivation layer 13, and a pixel electrode layer 14. The substrate 11 comprises switching elements and a gate lines (not shown). The common electrode layer 12 is arranged on the substrate 11 and provided with a common electrode BITO. A plurality of first via holes 121 are provided at predetermined positions on the common electrode layer 12. The passivation layer 13 is arranged on the common electrode layer 12, and has a plurality of second via holes 131 disposed concentrically with the first via holes 121. The pixel electrode layer 14 is arranged on the passivation layer 13, and provided with a plurality of pixel electrodes TITO connected to the switching elements through corresponding second via holes. Areas of the first via holes 121 are configured to gradually reduce in the direction from an output proximal end to an output distal end of a gate line so as to change an overlap area of the common electrode and the pixel electrodes. In this case, the voltage drops across the gate line are equal to each other so that brightness uniformity of the display panel is enhanced.

The above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. An array substrate, comprising:
   a substrate, which comprises switching elements and gate lines;
   a common electrode layer arranged on the substrate and provided with a common electrode, wherein a plurality of first via holes are provided at predetermined positions on the common electrode layer;
a passivation layer arranged on the common electrode layer and having a plurality of second via holes disposed concentrically with the first via holes; and
a pixel electrode layer arranged on the passivation layer and provided with a plurality of pixel electrodes connected to the switching element through corresponding second via holes;
wherein, areas of the first via holes are configured to gradually decrease in a direction along an output proximal end to an output distal end of the gate line.

2. The array substrate according to claim 1, further comprising:
a dielectric layer arranged on the common electrode layer; and
a touch wiring layer arranged on the dielectric layer and provided thereon with the passivation layer.

3. The array substrate according to claim 2, wherein the common electrode is configured to serve as a touch electrode and is connected with some wires in the touch wiring layer.

4. The array substrate according to claim 1, wherein the switching element comprises:
a channel layer arranged on the substrate and including a plurality of conductive channels;
a first insulating layer arranged on the channel layer;
a first conductive layer which is arranged on the first insulating layer and is configured to correspond to the conductive channel, the first conductive layer including a gate of the switching element;
a second insulating layer arranged on the first conductive layer and the exposed first insulating layer;
a second conductive layer arranged on the second insulating layer and including a source and a drain of the switching element, for connecting the channel layer; and
a flat layer arranged on the second conductive layer and the exposed second insulating layer and provided thereon with the common electrode layer.

5. The array substrate according to claim 4, wherein the channel layer is made of a low-temperature poly-silicon material and further comprises heavily ion-doped regions disposed at both ends of the conductive channel, the ion heavily doped region comprising a drain region connected with a drain of the switching element, and a source region connected with a source of the switching element.

6. The array substrate according to claim 5, wherein a slightly ion-doped region is provided between the conductive channel and the heavily ion-doped region.

7. The array substrate according to claim 6, further comprising a shading layer which is disposed on the substrate and is configured to correspond to the conductive channel.

8. The array substrate according to claim 7, further comprising a third insulating layer arranged on the shading layer and the exposed substrate and provided thereon with the channel layer.

9. A photomask used for manufacturing an array substrate, and the array substrate comprising:
a substrate, which comprises gate lines;
a common electrode layer arranged on the substrate and provided with a common electrode, wherein a plurality of first via holes are provided at predetermined positions on the common electrode layer;
wherein the photomask is provided with light transmitting regions corresponding to the plurality of first via holes, and areas of the light transmitting regions are configured to gradually decrease in the direction along an output proximal end to the output distal end of the gate line on the substrate.

10. A display device comprising an array substrate, wherein the array substrate comprises:
a substrate, which comprises switching elements and gate lines;
a common electrode layer arranged on the substrate and provided with a common electrode, wherein a plurality of first via holes are provided at predetermined positions on the common electrode layer;
a passivation layer arranged on the common electrode layer and having a plurality of second via holes disposed concentrically with the first via holes; and
a pixel electrode layer arranged on the passivation layer and provided with a plurality of pixel electrodes connected to the switching element through the corresponding second via holes;
wherein, areas of the first via holes are configured to gradually decrease in the direction along an output proximal end to an output distal end of the gate line.

11. The display device according to claim 10, further comprising: a dielectric layer arranged on the common electrode layer; and a touch wiring layer arranged on the dielectric layer and provided thereon with the passivation layer.

12. The display device according to claim 11, wherein the common electrode is configured to serve as a touch electrode and is connected with some wires in the touch wiring layer.

13. The display device according to claim 10, wherein the switching element comprises:
a channel layer arranged on the substrate and including a plurality of conductive channels;
a first insulating layer arranged on the channel layer;
a first conductive layer which is arranged on the first insulating layer and is configured to correspond to the conductive channel, the first conductive layer including a gate of the switching element;
a second insulating layer arranged on the first conductive layer and the exposed first insulating layer;
a second conductive layer arranged on the second insulating layer and including a source and a drain of the switching element for connecting the channel layer; and
a flat layer arranged on the second conductive layer and the exposed second insulating layer and provided thereon with the common electrode layer.

14. The display device according to claim 13, wherein the channel layer is made of a low-temperature poly-silicon material and further comprises heavily ion-doped regions disposed at both ends of the conductive channel, the ion heavily doped region comprising a drain region connected with the drain of the switching element, and a source region connected with the source of the switching element.

15. The display device according to claim 14, wherein a slightly ion-doped region is provided between the conductive channel and the heavily ion-doped region.

16. The display device according to claim 15, further comprising a shading layer which is arranged on the substrate and is configured to correspond to the conductive channel.

17. The display device according to claim 16, further comprising a third insulating layer arranged on the shading layer and the exposed substrate and provided thereon with the channel layer.

18. The display device according to claim 11, wherein the dielectric layer is arranged between the touching wiring layer and the common electrode layer and configured to space the common electrode layer from the touch wiring layer;

the touching wiring layer comprises a first wiring line and a second wiring line spaced apart from the first wiring line; the first wiring line is connected with the common electrode; the second wiring line is spaced apart and insulated from the common electrode layer by using the dielectric layer.

19. The array substrate according to claim 2, wherein the dielectric layer is arranged between the touching wiring layer and the common electrode layer and configured to space the common electrode layer from the touch wiring layer;

the touching wiring layer comprises a first wiring line and a second wiring line spaced apart from the first wiring line; the first wiring line is connected with the common electrode; the second wiring line is spaced apart and insulated from the common electrode layer by using the dielectric layer.

\* \* \* \* \*